United States Patent
Yang et al.

(10) Patent No.: US 8,455,288 B2
(45) Date of Patent: Jun. 4, 2013

(54) METHOD FOR ETCHING MATERIAL LONGITUDINALLY SPACED FROM ETCH MASK

(75) Inventors: Kuang L. Yang, Newton, MA (US); Thomas D. Chen, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/232,282

(22) Filed: Sep. 14, 2011

(65) Prior Publication Data
US 2013/0065343 A1    Mar. 14, 2013

(51) Int. Cl.
*H01L 21/00* (2006.01)

(52) U.S. Cl.
USPC ................................ 438/53; 216/2

(58) Field of Classification Search
USPC ......... 438/53, 733, 735, 737, 750, 944; 216/2
See application file for complete search history.

(56) References Cited

U.S. PATENT DOCUMENTS

| 7,449,356 | B2 | 11/2008 | Weigold | 438/53 |
| 2005/0227184 | A1* | 10/2005 | Heim et al. | 430/315 |
| 2006/0284516 | A1* | 12/2006 | Shimaoka et al. | 310/322 |
| 2007/0065968 | A1* | 3/2007 | Kok et al. | 438/53 |
| 2008/0304681 | A1* | 12/2008 | Langlois et al. | 381/174 |

* cited by examiner

*Primary Examiner* — Thao Le
*Assistant Examiner* — Laura Dykes
(74) *Attorney, Agent, or Firm* — Sunstein Kann Murphy & Timbers LLP (57) ABSTRACT

A micromachining process forms a plurality of layers on a wafer. This plurality of layers includes both a support layer and a given layer. The process also forms a mask, with a mask hole, at least in part on the support layer. In this configuration, the support layer is positioned between the mask hole and the given layer, and longitudinally spaces the mask hole from the given layer. The process also etches a feature into the given layer through the mask hole.

20 Claims, 10 Drawing Sheets

METHOD FOR ETCHING MATERIAL LONGITUDINALLY SPACED FROM ETCH MASK

FIELD OF THE INVENTION

The invention generally relates to MEMS devices and, more particularly, the invention relates to processes for forming micromachined devices.

BACKGROUND OF THE INVENTION

Microelectromechanical systems ("MEMS") are used in a growing number of applications. For example, MEMS currently are implemented as gyroscopes to detect pitch angles of airplanes, as microphones for use in mobile telephones, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle, incident acoustic signal, or acceleration).

As known by those skilled in the art, one commonly used technique for forming MEMS devices, known as "surface micromachining," builds material layers on top of a substrate using additive and subtractive processes. The complexity of surface micromachining processes often increases, however, as more layers are added to and subtracted from the substrate. Thick layers, such as rigid backplates in a MEMS microphone, present further challenges to the micromachining process.

SUMMARY OF THE INVENTION

In accordance with one embodiment of the invention, a micromachining process forms a plurality of layers on a wafer. This plurality of layers includes both a support layer and a given layer. The process also forms a mask, with a mask hole, at least in part on the support layer. In this configuration, the support layer is positioned between the mask hole and the given layer, and longitudinally spaces the mask hole from the given layer. The process also etches a feature into the given layer through the mask hole.

Some embodiments etch the feature by directing a first etchant through a void longitudinally between the mask and the given layer. To that end, the process may remove material between the mask and the given layer (to form the void) by directing a preliminary etchant through the mask hole. For example, the first etchant, which may include a reactive ion etch material, passes through the mask hole and through the void to etch the feature into the given layer. The void also may have a wall with an exposed material that is etchable by the first etchant, but only if contacted by the first etchant. In that case, the first etchant illustratively leaves the exposed material substantially unetched.

Among other things, the feature may include a layer hole through the given layer. This layer hole may be sized to have a feature maximum inner dimension. In a like manner, the mask hole also has a hole maximum inner dimension, which is substantially the same as the feature maximum inner dimension. In contrast, the void has a void maximum inner dimension that is larger than the hole maximum inner dimension.

The plurality of layers also may include a deeper layer that is exposed to the void through the layer hole. In that case, the method also may direct a second etchant through 1) the mask hole, 2) void and 3) layer hole to remove at least a portion of the deeper layer. In some embodiments, the first etchant includes an oxide etchant, and the second etchant includes a silicon etchant.

The plurality of layers may include any of a number of other layers, such as a diaphragm layer between a first backplate layer and a second backplate layer. Moreover, the support layer may include a structural layer, while the given layer may include a sacrificial layer.

In accordance with other embodiments, a micromachining method provides a wafer having a plurality of layers. This plurality of layers includes a first layer having first sacrificial material, an intervening layer, and a second layer having first sacrificial material. The first sacrificial material in the first layer is discontiguous with the first sacrificial material in the second layer—e.g., the intervening layer separates the first sacrificial material in the first layer from the first sacrificial material in the second layer. The method then forms an etch mask, on the wafer, with a mask hole that is spaced from the intervening layer. Next, the method directs a first etchant through the mask hole to remove at least some of the first material from the first layer to form a void that terminates at the intervening layer. A directional etchant then is passed through the mask hole and the void to form a intervening layer hole through the intervening layer.

In accordance with other embodiments, a method of forming a MEMS microphone provides a wafer having a lower backplate layer, an upper backplate layer, and a diaphragm layer between the top and lower backplate layers. The wafer also has a first sacrificial layer and a second sacrificial layer between the diaphragm layer and upper backplate layer. Next, the method forms an etch mask with a mask hole on the wafer. In this configuration, the upper backplate layer is between the mask hole and the first sacrificial layer, where the backplate layer spaces the mask hole from the first sacrificial layer. The method also passes a first etchant through the mask hole to form a void that terminates at the first sacrificial layer, and then passes a second etchant through the mask hole and the void to form a shadow hole through the first sacrificial layer.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIGS. 5A-5L explicitly show details of the microphone of FIG. 2 at specific steps of the process shown in FIGS. 4A and 4B. Each figure is briefly described immediately below.

DESCRIPTION OF ILLUSTRATIVE EMBODIMENTS

Illustrative embodiments enable micromachining processes to perform long-range etches—i.e., the opening in their mask is spaced from the surface it etches. As a result, micromachining processes now can fabricate improved and more robust MEMS devices. For example, this process improves current state-of-the-art fabrication processes to produce more robust double-backplate MEMS microphones. Details of illustrative embodiments are discussed below.

Figure 1:
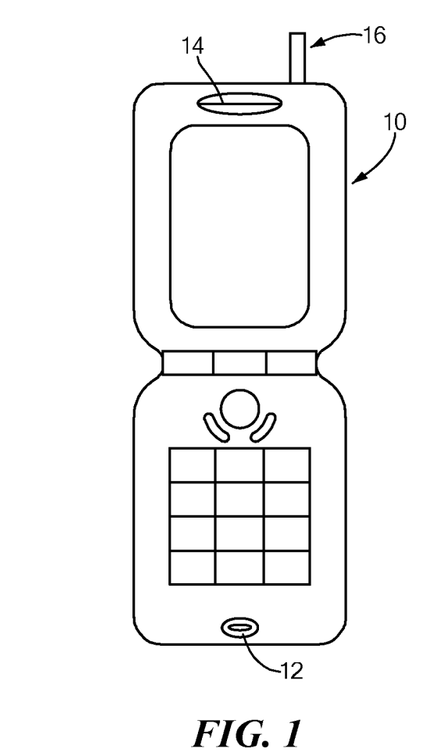
FIG. 1 schematically shows a mobile telephone that may use a MEMS microphone configured and fabricated in accordance with illustrative embodiments of the invention.

FIG. 1 schematically shows a mobile telephone 10 that can use a microphone configured and fabricated in accordance with illustrative embodiments. It should be noted, however, that discussion of a mobile telephone 10 and a specific MEMS device (i.e., a microphone) is for illustration only and thus, not intended to limit all embodiments of the invention. Accordingly, various embodiments apply to other micromachined devices, such as inertial sensors, gas detectors, network switches, etc. . . . .

In simplified terms, the telephone 10 has a receiver 12 for receiving an audio signal (e.g., a person's voice), a speaker portion 14 for generating audio signals, and a transponder 16 for transmitting and receiving electromagnetic signals encoding audio signals. During use, a person may speak into the receiver 12, which has a MEMS microphone 18 (FIG. 2, discussed below) that converts the person's voice into an electrical signal. Internal logic (not shown) and the transponder 16 modulate this signal to a remote source, such as to a satellite tower and, ultimately, to another person on another telephone 10.

The telephone 10 may use any of a number of different types of microphones known of the art. Some applications, however, require a MEMS microphone 18 with the detection capability for high maximum sound pressure, broad bandwidth, and a decreased risk of pull-down. To those ends, a dual-backplate microphone 18, which has a movable diaphragm 22 sandwiched between two single-crystal backplates, should suffice.

Figure 2:
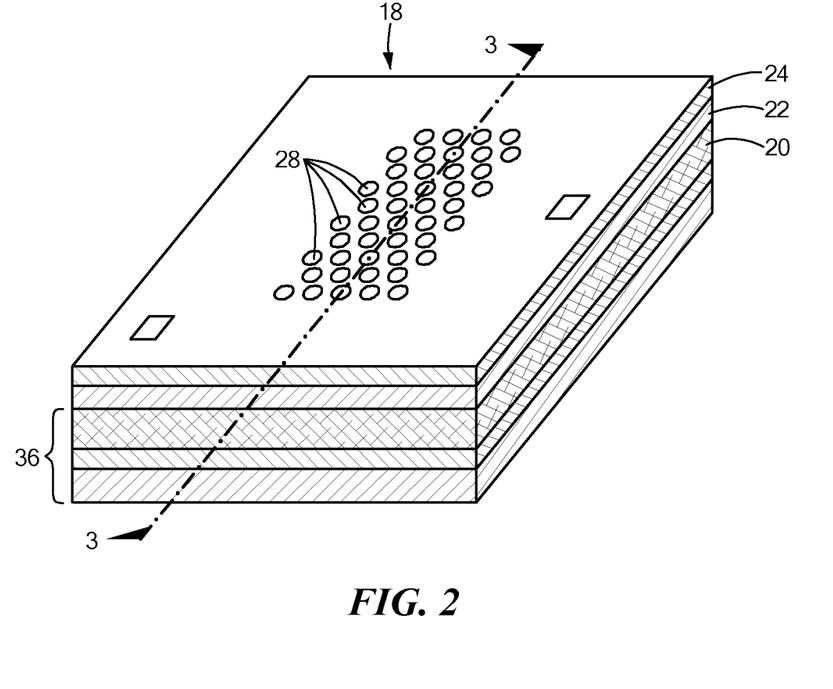
FIG. 2 to schematically shows a prospective view of a MEMS microphone that may be configured and fabricated in accordance with illustrative embodiments of the invention.
Figure 3:
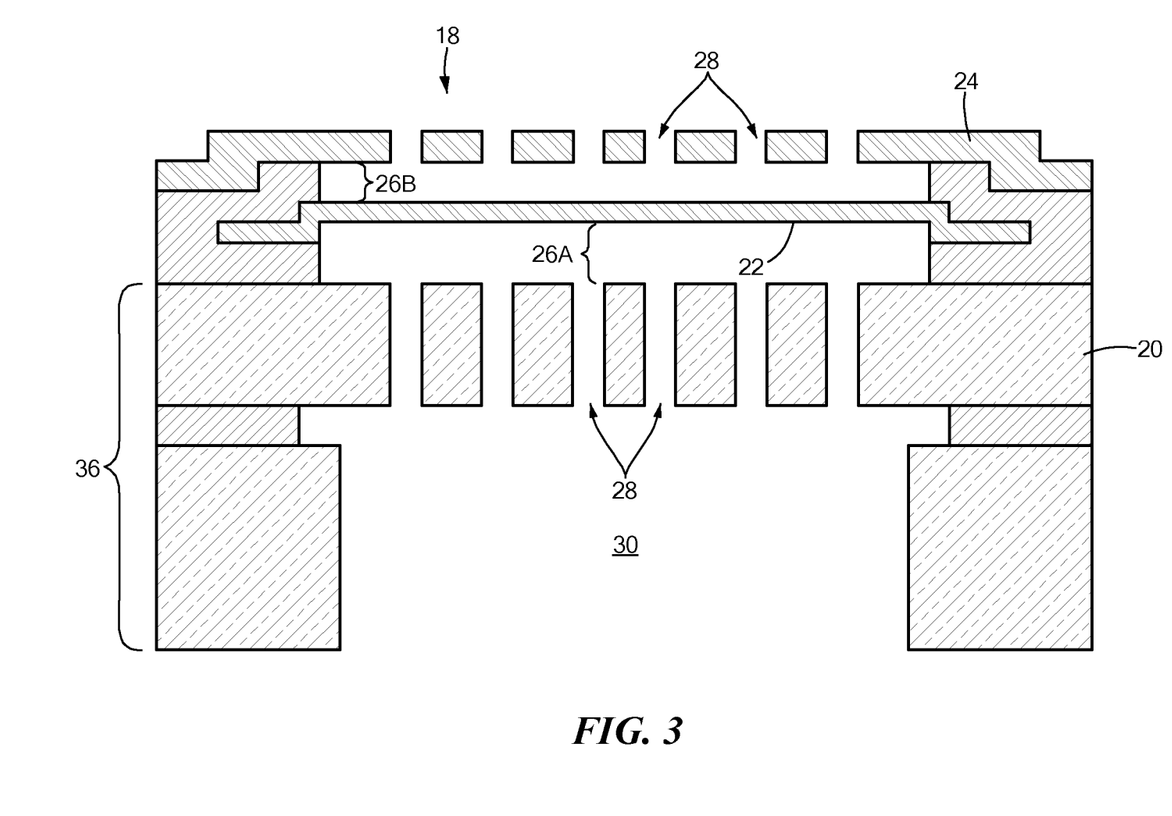
FIG. 3 schematically shows a cross-sectional view of the MEMS microphone of FIG. 2 across section line 3-3.

To that end, FIG. 2 schematically shows a top, prospective view of a dual backplate MEMS microphone 18 (also referred to as a "microphone chip 18") configured and fabricated according to illustrative embodiments of the invention. FIG. 3 schematically shows a cross-sectional view of the same microphone 18 across section line 3-3 of FIG. 2.

Among other things, the microphone 18 includes a static lower backplate 20 that supports and forms a variable capacitor 26A with a flexible diaphragm 22, and a static upper backplate 24 that also forms a variable capacitor 26B with the diaphragm 22. The diaphragm 22 thus forms two capacitors 26A and 26B—one with each backplate. When the diaphragm 22 moves closer to one backplate (e.g., in response to receipt of an acoustic signal, discussed below), it moves farther away from the other backplate. Because capacitance is inversely proportional to the gap between the diaphragm 22 and backplate, the capacitance formed by the diaphragm 22 moving toward one backplate increases, while the capacitance formed by the diaphragm 22 moving away from the other backplate decreases.

To facilitate operation, the lower backplate 20 and upper backplate 24 both have a plurality of through-hole apertures 28 ("backplate apertures 28") that permit an acoustic signal to contact the diaphragm 22. The backside apertures 28 through the lower backplate 20 lead to a backside cavity 30.

Figure 5A:
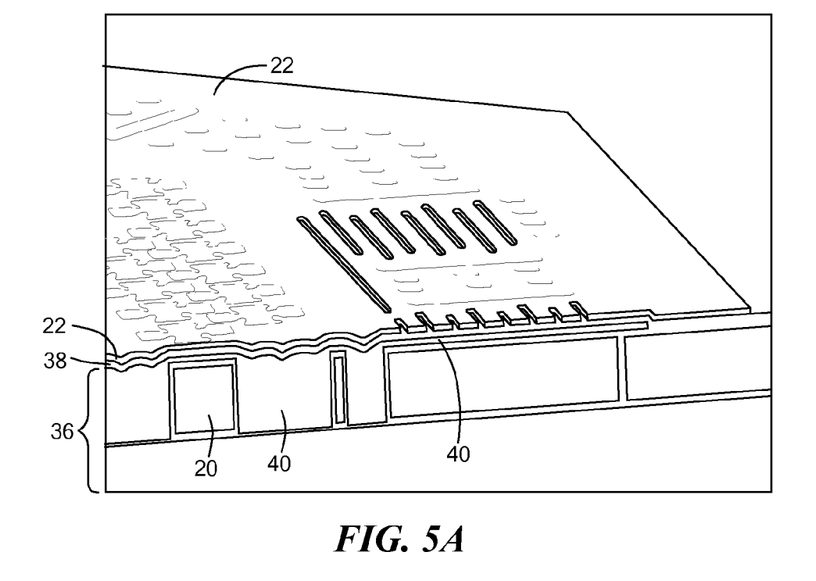
FIG. 5A schematically shows the microphone at the microphone at step 400, which forms the lower backplate and diaphragm.

In illustrative embodiments, the lower backplate 20 is formed from single crystal silicon (e.g., the top layer of a silicon-on-insulator wafer 36, discussed below in FIG. 5A-end), while the diaphragm 22 and upper backplate 24 are formed from a deposited material, such as deposited polysilicon. Other embodiments, however, use other types of materials to form the lower backplate 20, upper backplate 24, and diaphragm 22. For example, a single crystal silicon bulk wafer, or some deposited material, may form the lower backplate 20. In a similar manner, a single crystal silicon bulk wafer, part of a silicon-on-insulator wafer, or some other deposited material may form the diaphragm 22.

Springs 32 movably connect the diaphragm 22 to a static/stationary portion of the microphone 18. The springs 32 effectively form a plurality of apertures (not shown) that permit at least a portion of the acoustic energy to pass through the diaphragm 22. These spring apertures, which also are referred to as "diaphragm apertures," may be any reasonable shape, such as in the shape of a slot, round hole, or some irregular shape. Other embodiments, however, may have other types of springs 32 and apertures 28.

Incident acoustic energy causes the diaphragm 22 to vibrate, thus producing a changing capacitance between it and the upper and lower backplates 24 and 20. Such acoustic energy may contact the microphone 18 from any direction. For example, the acoustic energy may travel upwardly, first through the lower backplate 20, and then partially through and against the diaphragm 22. In other embodiments, the acoustic energy may travel in the opposite direction. On-chip or off-chip circuitry (not shown) receive (via contacts 36 of FIG. 2) and convert this changing capacitance into electrical signals that can be further processed.

Figure 4A:
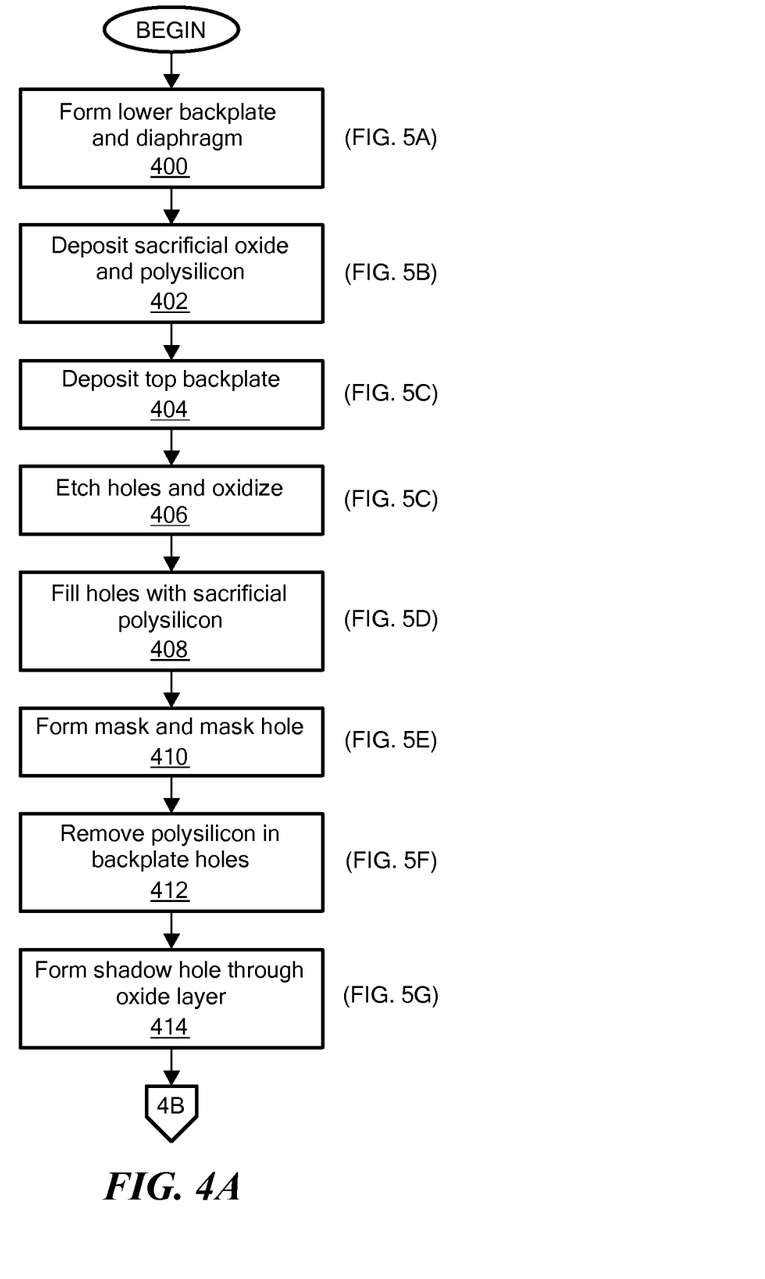
FIGS. 4A and 4B show a process of forming the MEMS microphone of FIG. 2 in accordance with illustrative embodiments of the invention.
Figure 4B:
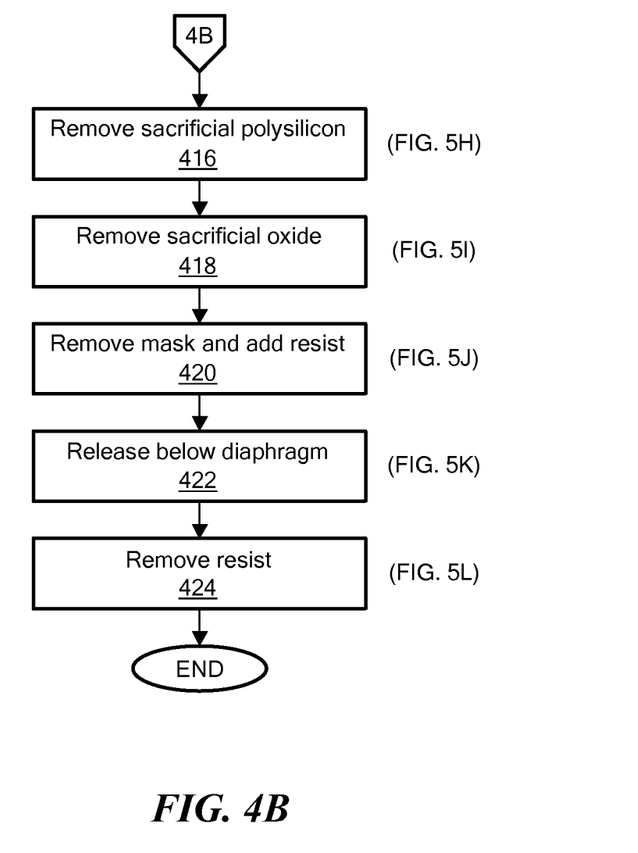

FIGS. 4A and 4B show a process of fabricating the microphone 18 of FIG. 2 in accordance with illustrative embodiments of the invention. It should be noted that for clarity, this described process is a significantly simplified version of an actual process used to form the MEMS microphone 18. Accordingly, those skilled in the art would understand that the process may have additional steps not explicitly shown in FIGS. 4A and 4B. Moreover, some of the steps may be performed in a different order than that shown, or at substantially the same time. Those skilled in the art should be capable of modifying the process to suit their particular requirements. To more clearly illustrate various embodiments, FIGS. 5A-5L show the microphone 18 at various steps of the process of FIGS. 4A and 4B.

The process begins at step 400, which forms the lower backplate 20 and unreleased diaphragm 22 in a conventional manner on a silicon-on-insulator wafer 36. To those ends, as shown in FIG. 5A, the process:

1) forms the lower backplate 20 from the top wafer of a silicon on insulator wafer 36,
2) forms the backplate holes through the backplate 20, and
3) oxidizes the holes and top surface of the backplate 20 to form a sacrificial oxide layer 38.

It should be noted that all sacrificial oxide in this process is identified by reference number 38—regardless of its location on the apparatus. Step 400 next fills the holes with a sacrificial polysilicon 40, and then generally planarizes the top surface with the same polysilicon to form a sacrificial polysilicon layer 40. In a manner similar to sacrificial oxide, all sacrificial polysilicon is identified by reference number 40—regardless of its location. The polysilicon 40 filling the backplate apertures 28 is contiguous with the generally planar sacrificial polysilicon layer 40.

Finally, step 400 oxidizes the top, generally planar surface of the sacrificial polysilicon layer 40 to form a sacrificial oxide layer 38, and then deposits and etches the diaphragm polysilicon on the sacrificial layer 38. Accordingly, this step concludes by forming the springs 32 that support the unreleased diaphragm 22.

It should be noted that various layers noted as being "substantially planar" may have small concavities or dimples on their surface. FIG. 5A clearly shows this phenomenon. For additional details of this and related processes, see, for example, U.S. Pat. No. 7,449,356, entitled, "PROCESS OF FORMING A MICROPHONE USING SUPPORT MEMBER," issued Nov. 11, 2008, assigned to Analog Devices, Inc. of Norwood, Mass., and naming Jason Weigold as inventor, the disclosure of which is incorporated herein, in its entirety, by reference.

Figure 5B:
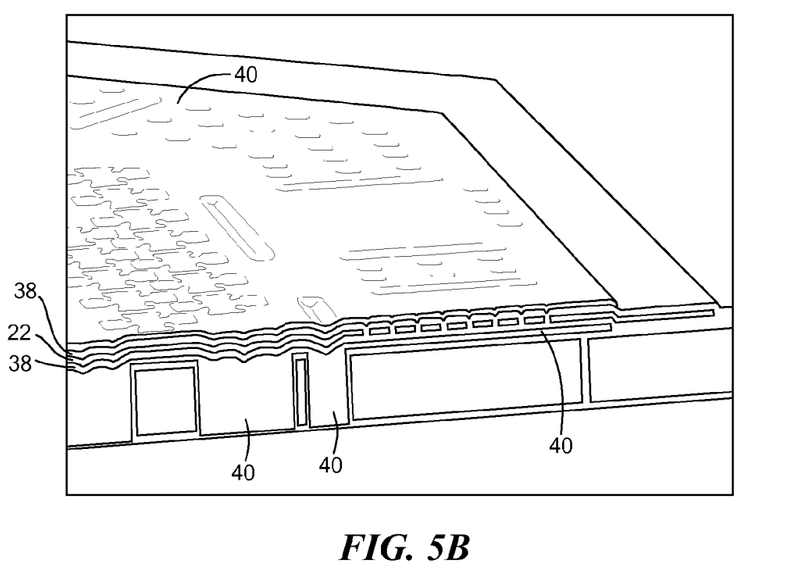
FIG. 5B schematically shows the microphone at step 402, which deposits sacrificial materials onto the wafer.
Figure 5C:
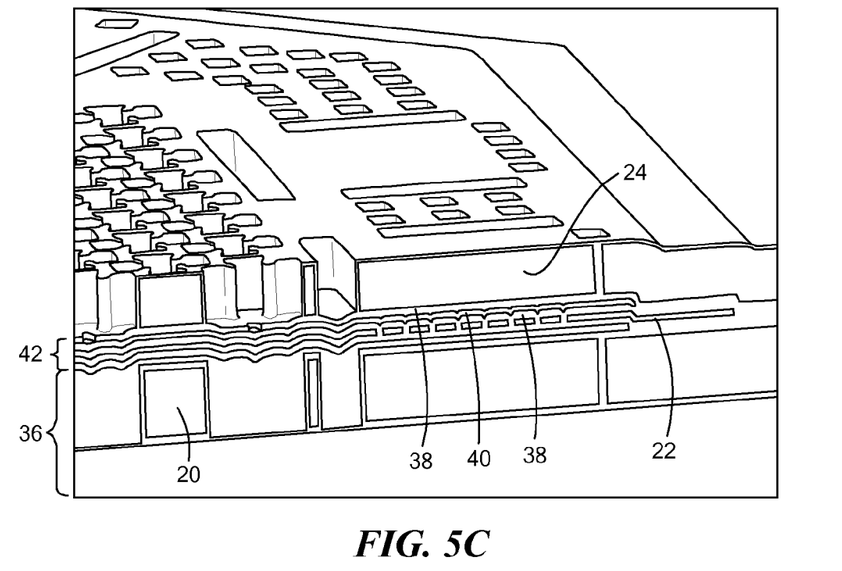
FIG. 5C schematically shows the microphone at steps 404 and 406, which deposit the upper backplate, etches holes through the backplate, and oxidizes the structure.
Figure 5D:
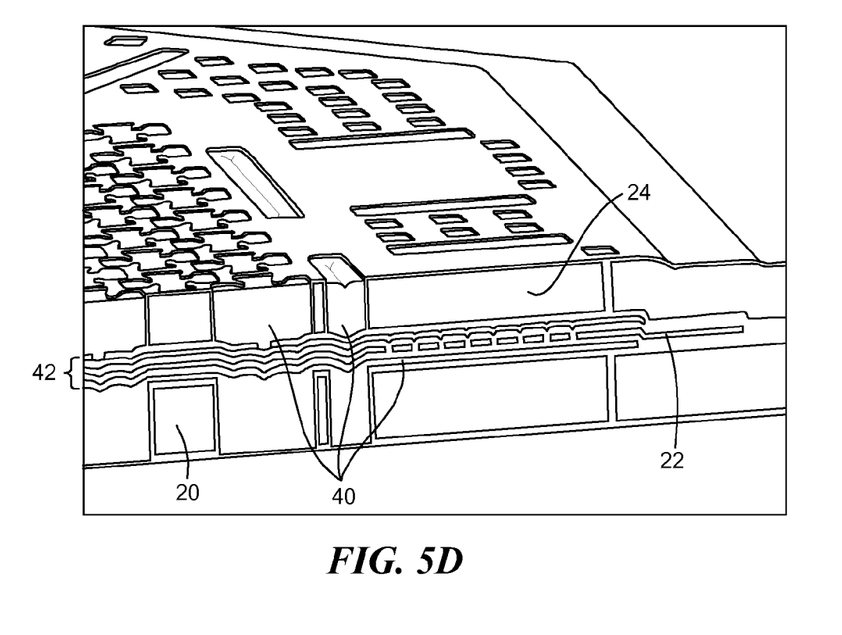
FIG. 5D schematically shows the microphone at step 408, which fills the holes in the backplate with sacrificial polysilicon.

After providing or forming the lower backplate 20 and diaphragm 22, the process continues to step 402, which deposits a multi-material sacrificial layer 42 on the diaphragm 22. To that end, as shown in FIG. 5B, step 402 deposits a first sacrificial oxide layer 38 on diaphragm 22, and then deposits a sacrificial polysilicon layer 40 over the first sacrificial oxide layer 38. Next, step 402 deposits a second sacrificial oxide layer 38 over the just deposited sacrificial polysilicon layer 40. FIG. 5C shows this second sacrificial oxide layer 38. This second sacrificial oxide layer 38 substantially completely covers this new sacrificial polysilicon layer 40.

Step 404 then deposits the upper backplate material onto the second sacrificial oxide layer 38 formed in step 402 (FIG. 5C). In illustrative embodiments, the backplate material includes polysilicon and is much thicker than the sacrificial polysilicon layers 40. For example, the upper backplate 24 preferably has about the same thickness as the lower backplate 20.

After forming the upper backplate 24, as also shown in FIG. 5C, step 406 forms holes/apertures 28 through the upper backplate 24, and then oxidizes the top exposed surface of the upper backplate 24. This oxidation produces an oxide layer 38 that lines all the apertures 28 and integrates with the sacrificial oxide layer 38 underneath the upper backplate 24. The apertures 28 formed in this step preferably include through-holes/apertures 28 through the upper backplate 24, among other holes.

The process continues to prepare the apparatus for supporting a mask 44. To that end, step 408 planarizes the top surface by filling the apertures/holes 28 with sacrificial polysilicon 40 (referred to as "fill polysilicon", FIG. 5D). This fill polysilicon 40 is surrounded on its sides and bottom by the sacrificial oxide layers 38 lining and formed beneath the apertures 28. Accordingly, the oxide 38 protects the backplate silicon from etches in subsequent steps. Undesirably, however, this oxide layer/liner 38 also separates the fill polysilicon from the sacrificial polysilicon one layer beneath it, thus creating difficulties in the process. The solution to this problem is discussed below.

Figure 5E:
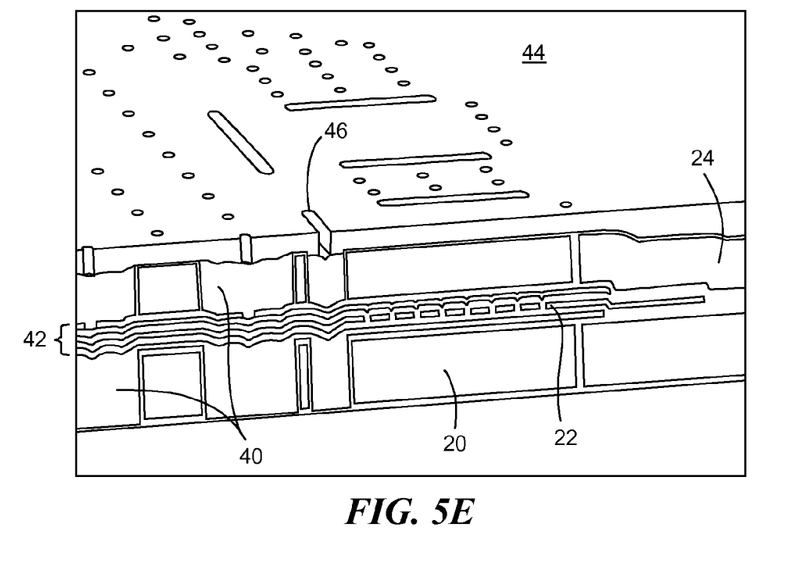
FIG. 5E schematically shows the microphone at step 410, which forms a mask and a mask hole.

After planarizing the top layer, the process continues to step 410, which forms an etch mask 44 on the exposed surface; namely, on top of the exposed oxide 38 and fill polysilicon 40 (FIG. 5E). This mask 44 has a plurality of mask holes 46 over certain regions containing fill polysilicon 40. In illustrative embodiments, the mask 44 is formed primarily from a photoresist material, while the mask holes 46 have a maximum inner dimension that is smaller than the maximum inner dimension of the apertures 28 through the upper backplate 24. For example, FIG. 5E shows a relatively long and narrow mask hole 46.

Figure 5F:
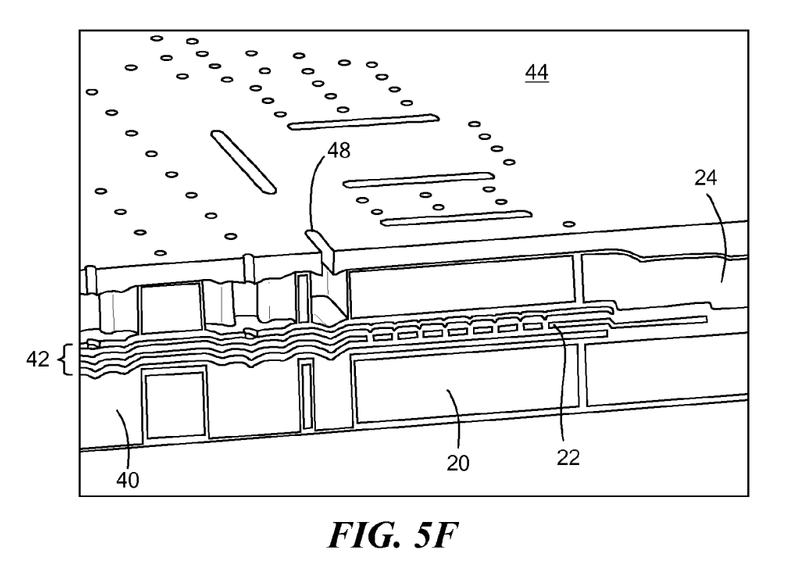
FIG. 5F schematically shows the microphone at step 412, which removes polysilicon from the backplate holes.

Step 412 then uses conventional processes to remove the fill polysilicon 40 within the backplate holes (FIG. 5F). For example, this step may direct gaseous xenon difluoride through the mask hole(s) 46 to remove the fill polysilicon 40. As noted above, the oxide 38 forming the inner surface of the aperture(s) 28 protects the backplate polysilicon from the xenon difluoride. Accordingly, step 412 forms a void/chamber/volume/hole (referred to as a "void 48") through which subsequent steps further etch the apparatus.

Figure 5G:
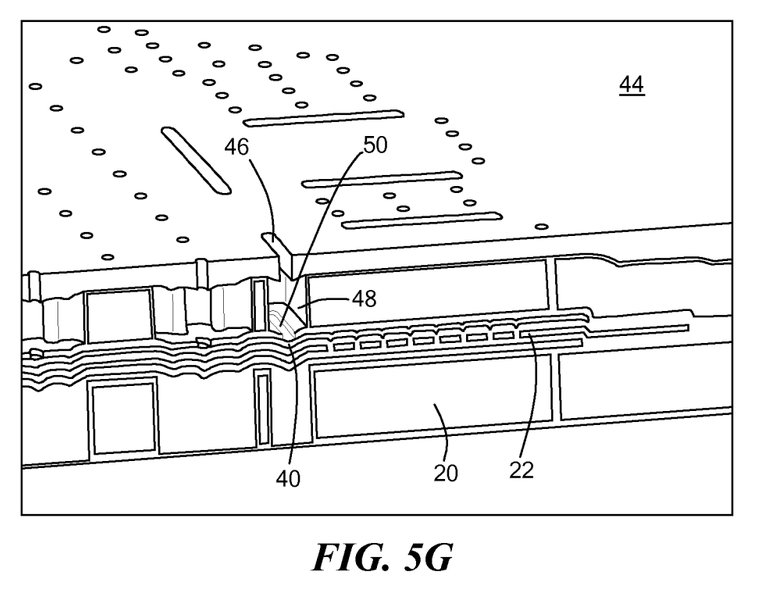
FIG. 5G schematically shows the microphone at step 414, which forms a shadow hole through the oxide layer.

More specifically, in accordance with illustrative embodiments of the invention, the process delivers a one directional etch to the oxide layer 38 exposed at the bottom of the void 48 (step 414, FIG. 5G). In other words, the process directs an etchant through the mask hole 46, the void 48, and toward the sacrificial oxide at the bottom of the void 48. This etch is completed without significantly etching any of the oxide material 38 from the sides of the voids 48, thus protecting the backplate silicon.

To those ends, the process directs a reactive ion etch through the void 48 and onto the sacrificial oxide 38 at the bottom of the void 48. Specifically, the ions in the reactive ion etch are one directional—they perform an anisotropic process that does not spread out toward the side walls of the void 48. Accordingly, this ensures that the side walls maintain their oxide 38, thus not exposing the backplate polysilicon to the void 48. This protects the backplate polysilicon from subsequent polysilicon etches (discussed below). Alternative embodiments may use other types of etches that accomplish the same results.

The reactive ion etch preferably forms a "shadow hole 50" (also referred to as a "shadow opening 50") in the sacrificial oxide 38 to expose the sacrificial polysilicon underneath such oxide layer 38. Since it is formed with a reactive ion etch, the shadow hole 50 should have a shape that substantially matches that of the mask hole 46. For example, the shadow hole 50 may have roughly the same dimensions and shape as that of the mask hole 46. In other embodiments, however, the dimensions may be different.

Figure 5H:
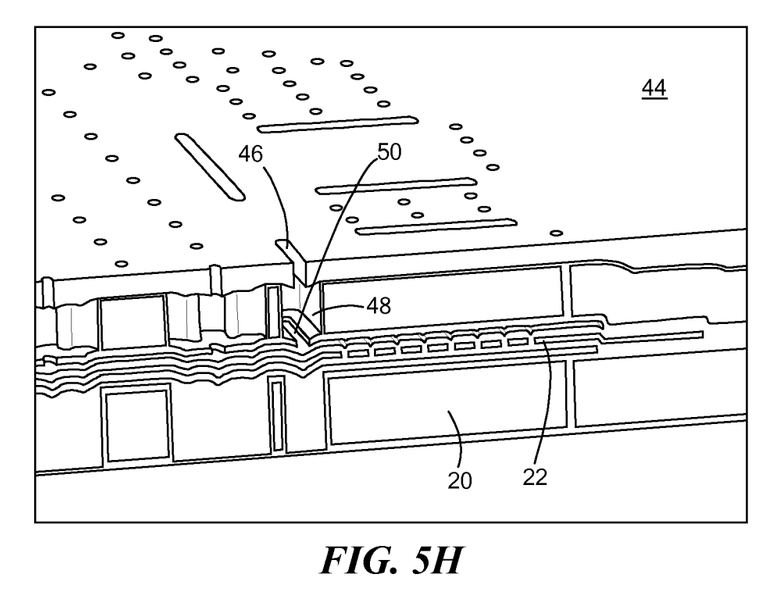
FIG. 5H schematically shows the microphone at step 416, which removes the sacrificial polysilicon.

The primary function of the shadow hole 50 is to access the formerly inaccessible, buried sacrificial polysilicon layer 40 within this apparatus. Accordingly, its small size should suffice to perform its function. To that end, step 416 removes the now exposed to sacrificial polysilicon by directing a polysilicon etchant through the shadow hole 50 (FIG. 5H). To that end, the process may direct gaseous xenon difluoride through the mask hole 46, void 48, and shadow hole 50, consequently removing the buried sacrificial polysilicon layer 40. As noted above, the oxide 38 lining the walls of the void 48 favorably protects the polysilicon of the upper backplate 24 during this step.

Figure 5I:
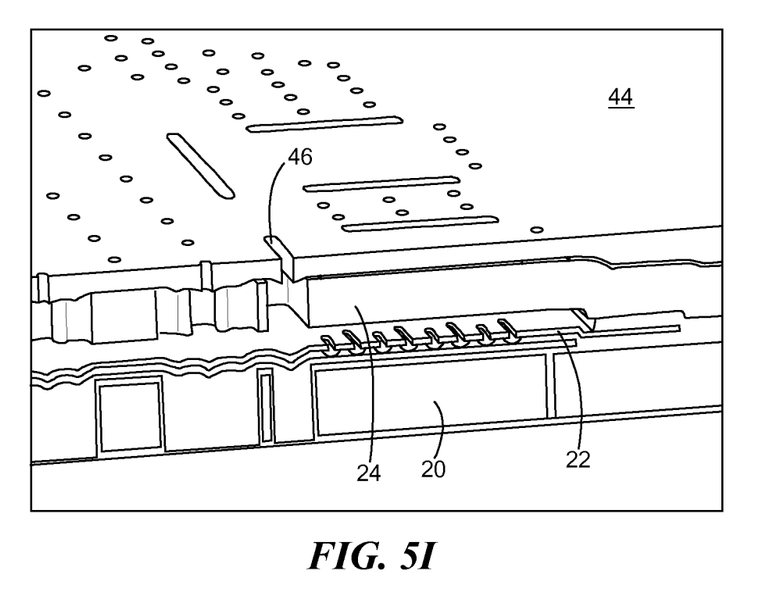
FIG. 5I schematically shows the microphone at step 418, which removes the sacrificial oxide.
Figure 5J:
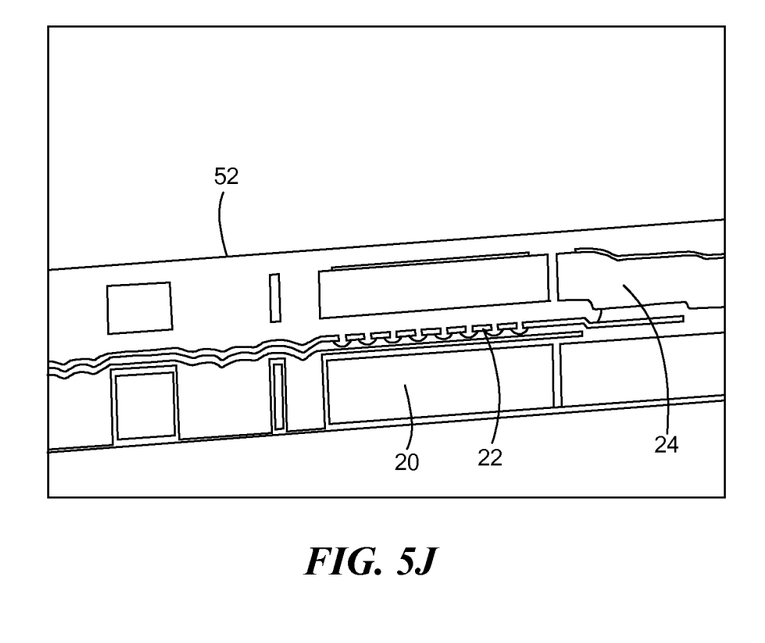
FIG. 5J schematically shows the microphone at step 420, which removes the mask and adds a photoresist layer.
Figure 5K:
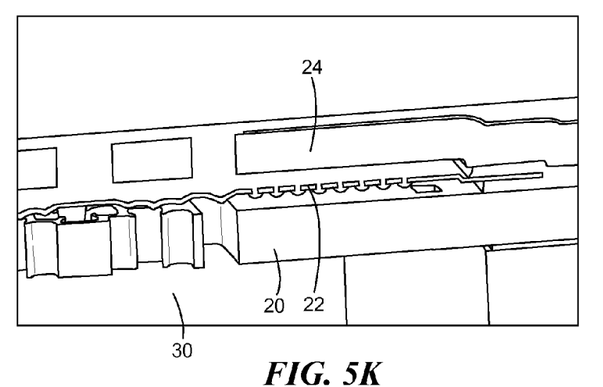
FIG. 5K schematically shows the microphone at step 422, which releases the structure below the diaphragm.
Figure 5L:
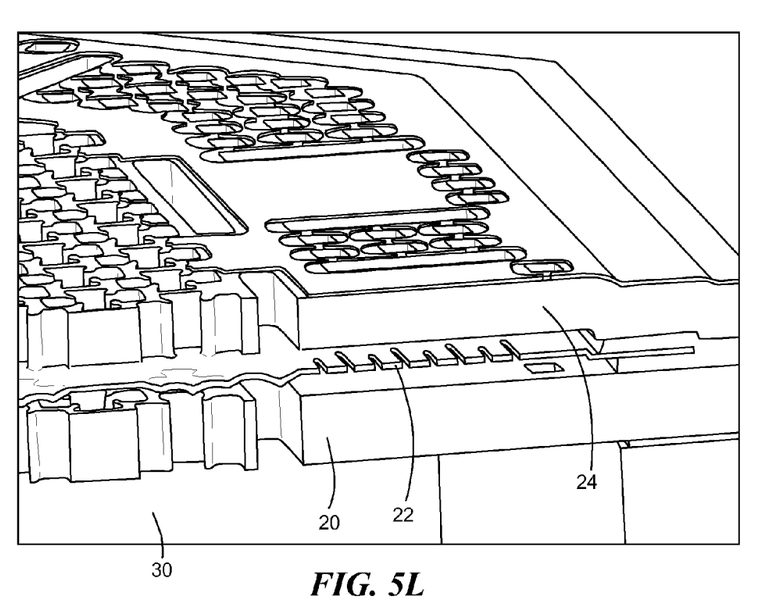
FIG. 5L schematically shows the microphone at step 424, which removes the remaining photoresist.

The shadow hole 50 thus overcomes the problem of having the fill polysilicon separated from the buried sacrificial polysilicon layer 40—it provides direct access to the buried sacrificial polysilicon layer 40. At this point, the process releases the top of the diaphragm 22 by removing much of the sacrificial oxide 38 between the mask 44 and the diaphragm 22. To that end, step 418 directs a wet oxide etchant, such as hydrofluoric acid, through the mask hole 46 and into the exposed regions of the apparatus (FIG. 5I). As shown in FIG. 5K, this step still maintains oxide that secures the diaphragm 22 within the apparatus.

The remainder of the process simply releases the underside of the diaphragm 22. Accordingly, step 420 removes the mask 44 and then begins releasing the diaphragm 22. To do that, however, the process rotates the apparatus around so that it is supported on the surface that once supported the mask 44. This cannot be done unless the released areas are temporarily refilled. Accordingly, as shown in FIG. 5J, step 420 fills substantially all open regions above the diaphragm 22 with photoresist (temporary photoresist 52") simply to provide structural support during some of the remaining steps.

The process concludes by releasing below the diaphragm 22 in a conventional manner and performing a cavity etch to form the backside cavity 30 (step 422 and FIG. 5K, also see prior incorporated patent), and removing the temporary photoresist 52 added by step 420 (step 424 and FIG. 5L), thus releasing the entire apparatus/microphone 18. Conventional dicing and packaging processes then can form the final double-backplate microphone 18 as discussed above.

Accordingly, illustrative embodiments enable long-distance etching by etching surfaces that are longitudinally spaced from the hole in the mask 44. The inventors discovered that a reactive ion etch, which, to their knowledge, previously was used to make straight walls in etched material, could be used to etch through a void 48 to form shadow holes 50. Of course, other embodiments can form other features in the etched surfaces other than shadow holes 50. Thus, those skilled in the art can modify the described processes to form other features in the etched surfaces. In fact, the single mask 44 discussed in FIGS. 4A and 4B could remain in place to etch even deeper layers within the apparatus (if they were there). In other words, a single mask 44 can remain in place to etch multiple, longitudinally spaced layers in a single apparatus.

This process represents a significant improvement over prior art processes that formed dual-backplate microphones with layer transfer processes. Now, the layers are more integrated and thus, more robust.

Although the above discussion discloses various exemplary embodiments of the invention, it should be apparent that those skilled in the art can make various modifications that will achieve some of the advantages of the invention without departing from the true scope of the invention.

What is claimed is:

1. A micromachining process comprising:
   forming a plurality of layers on a wafer, the plurality of layers including a support layer, a given layer, and a deeper layer,
   the given layer being between the support layer and the deeper layer,
   the support layer having common material, the deeper layer also having common layer material, the common material in the deeper layer being discontiguous with the common material in the support layer, the given layer separating the common material in the support layer from the common material in the deeper layer;
   forming a mask at least in part on the support layer, the mask having a mask hole, the support layer being between the mask hole and the given layer, the support layer longitudinally spacing the mask hole from the given layer; and
   etching a feature into the given layer through the mask hole; and
   etching the common material in the deeper layer through the mask hole in the mask and through the feature in the given layer.

2. The micromachined process as defined by claim 1 wherein etching a feature comprises directing a first etchant through a void between the mask and the given layer.

3. The micromachined process as defined by claim 2 further comprising:
   removing material between the mask and the given layer to form the void, removing comprising directing a preliminary etchant through the mask hole in the mask.

4. The micromachined process as defined by claim 2 wherein the first etchant comprises a reactive ion etch material, the first etchant passing through the mask hole and through the void to etch the feature into the given layer.

5. The micromachined process as defined by claim 2 wherein the void has a wall with an exposed material that is etchable by the first etchant if contacted, the first etchant leaving the exposed material substantially unetched.

6. The micromachined process as defined by claim 2 wherein the feature includes a layer hole through the given layer.

7. The micromachined process as defined by claim 6 wherein the layer hole includes a feature maximum inner dimension, the mask hole having a hole maximum inner dimension that is substantially the same as the feature maximum inner dimension.

8. The micromachined process as defined by claim 6 wherein the void has a void maximum inner dimension, the mask hole having a hole maximum inner dimension, the hole maximum inner dimension being smaller than the void maximum inner dimension.

9. The micromachined process as defined by claim 1 wherein the plurality of layers includes a diaphragm layer between a first backplate layer and a second backplate layer.

10. The micromachined process as defined by claim 1 wherein the support layer includes a structural layer and the given layer includes a sacrificial layer.

11. A micromachining method comprising:
    providing a wafer having a plurality of layers, the plurality of layers including a first layer having first sacrificial material, an intervening layer, and a second layer having first sacrificial material,
    the first sacrificial material in the first layer being discontiguous with the first sacrificial material in the second layer, the intervening layer separating the first sacrificial material in the first layer from the first sacrificial material in the second layer;
    forming an etch mask on the wafer, the etch mask having an mask hole, the mask hole being spaced from the intervening layer;
    directing a first etchant through the mask hole to remove at least some of the first material from the first layer to form a void that terminates at the intervening layer; and passing a directional etchant through the mask hole and the void to form a intervening layer hole through the intervening layer.

12. The method as defined by claim 11 wherein the intervening layer hole exposes the first material in the second layer, the method further comprising passing an etchant through the mask hole, void, and intervening layer hole to remove at least a portion of the first material in the second layer.

13. The method as defined by claim 11 wherein the wafer has a support layer at least in part supporting the etch mask, the support layer being between the etch mask and the first layer.

14. The method as defined by claim 11 wherein the first sacrificial material comprises silicon.

15. The method as defined by claim 11 wherein the void has a void maximum inner dimension, the mask hole having a hole maximum inner dimension, the hole maximum inner dimension being smaller than the void maximum inner dimension.

16. A method of forming a MEMS microphone, the method comprising:
   providing a wafer having a lower backplate layer, an upper backplate layer, and a diaphragm layer between the top and lower backplate layers, the wafer having a first sacrificial layer and a second sacrificial layer between the diaphragm layer and upper backplate layer;
   forming an etch mask with a mask hole on the wafer, the upper backplate layer being between the mask hole and the first sacrificial layer, the backplate layer spacing the mask hole from the first sacrificial layer;
   passing a first etchant through the mask hole to form a void that terminates at the first sacrificial layer;
   passing a second etchant through the mask hole and the void to form a shadow hole through the first sacrificial layer.

17. The method as defined by claim 16 wherein the shadow hole exposes the second sacrificial layer to the void, the method further comprising passing the first etchant through the mask hole, void, and shadow hole to remove at least a portion of the second sacrificial layer.

18. The method as defined by claim 17 wherein providing comprises providing the upper backplate layer with a chamber having sacrificial material, the act of passing a first etchant through the mask hole removing at least a portion of the sacrificial material to form the void.

19. The method as defined by claim 16 wherein the second etchant comprises a directional etchant.

20. The method as defined by claim 16 further comprising releasing the diaphragm layer.

* * * * *